United States Patent
Park

(10) Patent No.: US 7,239,561 B2
(45) Date of Patent: Jul. 3, 2007

(54) DATA I/O CIRCUIT OF FLASH MEMORY DEVICE WITH IMPROVED DATA I/O SPEED STRUCTURE

(75) Inventor: Jin Park, Daegu-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/306,473

(22) Filed: Dec. 29, 2005

(65) Prior Publication Data

US 2007/0002625 A1    Jan. 4, 2007

(30) Foreign Application Priority Data

Jun. 29, 2005  (KR) ...................... 10-2005-0057302

(51) Int. Cl.
*G11C 7/06*    (2006.01)

(52) U.S. Cl. ........................... 365/189.07; 365/189.05; 365/190

(58) Field of Classification Search ........... 365/189.05, 365/189.08, 189.07, 189.03, 190
See application file for complete search history.

(56) References Cited

U.S. PATENT DOCUMENTS

| | | | |
|---|---|---|---|
| 6,980,473 B1 * | 12/2005 | Bautista et al. ........ | 365/189.01 |
| 7,006,380 B2 * | 2/2006 | Toda ...................... | 365/185.21 |
| 7,142,460 B2 * | 11/2006 | Lee et al. .............. | 365/185.29 |
| 2006/0155896 A1 * | 7/2006 | Lee et al. ...................... | 710/52 |
| 2007/0019468 A1 * | 1/2007 | Seong et al. ........... | 365/185.03 |

* cited by examiner

*Primary Examiner*—Richard T. Elms
*Assistant Examiner*—Hien N Nguyen
(74) *Attorney, Agent, or Firm*—Marshall, Gerstein & Borun LLP

(57) ABSTRACT

A data I/O circuit of a flash memory device includes a page buffer connected to at least one pair of bit lines, a page buffer select circuit arranged to output complementary input data, which is received through a pair of I/O lines, to the page buffer, or outputs complementary sensing data stored in the page buffer to the pair of I/O lines, in response to a buffer select signal, and a column select circuit arranged to output the complementary sensing data, which is received through the pair of I/O lines, to a pair of data I/O nodes, respectively, or to output the complementary input data, which is received through the pair of data I/O nodes, to the pair of I/O lines, in response to a column select signal and a gate control signal.

10 Claims, 4 Drawing Sheets

US 7,239,561 B2

DATA I/O CIRCUIT OF FLASH MEMORY DEVICE WITH IMPROVED DATA I/O SPEED STRUCTURE

BACKGROUND

This disclosure relates to flash memory devices and more specifically, to a data I/O circuit of flash memory devices.

In general, a data I/O circuit of a flash memory device includes a page buffer 11, a column select circuit 12, a data line discharge circuit 13 and an sense amplifier circuit 14, as shown in FIG. 1.

The page buffer 11 includes a bit line selector 20, a register circuit 30, switches 40, 60, a data input circuit 50 and a precharge circuit 70. The bit line selector 20 includes NMOS transistors 21 to 24. The register circuit 30 includes a sensing circuit 31 and a latch circuit 32. The data input circuit 50 includes NMOS transistors 51, 52. The switches 40, 60 are each implemented using an NMOS transistor and will be hereinafter referred to as an NMOS transistor. The sources of the NMOS transistors 51, 52 and 60 are all connected to a node D3.

Furthermore, the drain of the NMOS transistor 51 is connected to a node D1 of the latch circuit 32. The drain of the NMOS transistor 52 is connected to a node D2 of the latch circuit 32. The switch 40 is connected between the node D2 and a sensing node S and is turned on or off in response to a program control signal (PRGM). The column select circuit 12 includes NMOS transistors 81, 82. The sense amplifier circuit 14 includes PMOS transistors 91, 91 and NMOS transistors 93, 94. The data I/O operation of the data I/O circuit 10 constructed above will be described in short.

Upon data input, the data line discharge circuit 13 precharges a data I/O node DION with a ground voltage (VSS) level in response to a discharge control signal (DL_DIS). Thereafter, if column select signals (YA_DRV, YB_DRV) are enabled, the column select circuit 12 connects the data I/O node DION to the node D3 through an I/O line DIO. As a result, the node D3 becomes the ground voltage (VSS) level. At this time, if one of the data input signals (DI, nDI) is enabled, the latch circuit 32 latches data of logic "1" or "0". Meanwhile, upon data output, the switch 60 connects the node D2 to the node D3 in response to the data output signal (PBDO). Furthermore, the column select circuit 12 connects the data I/O node DION to the node D3 through the I/O line DIO in response to the column select signals (YA_DRV, YB_DRV). Consequently, data stored in the latch circuit 32 is input to the sense amplifier circuit 14 consecutively through the node D3, the I/O line DIO, the column select circuit 12 and the data I/O node DION.

As described above, in the data I/O circuit 10 of the flash memory device in the related art, during the data I/O operation, input or output data are transmitted to the page buffer 11 or the sense amplifier circuit 14 through a single data I/O node DION. In this structure, a problem arises because the data I/O speed is decreased although the number of the whole transistors can be reduced. Furthermore, the page buffer 11 must include both the path (i.e., the data input circuit 50) through which data is input to the register circuit 30 and the path (i.e., the switch 60) through which data stored in the register circuit 30 is output. Accordingly, a problem arises because the page buffer 11 becomes bulky.

SUMMARY

A data I/O circuit of a flash memory device includes a page buffer, a page buffer select circuit and a column select circuit. The page buffer is connected to at least one pair of bit lines. The page buffer select circuit is arranged to output complementary input data, which is received through a pair of I/O lines, to the page buffer, or outputs complementary sensing data stored in the page buffer to the pair of I/O lines, in response to a buffer select signal. The column select circuit is arranged to output the complementary sensing data, which is received through the pair of I/O lines, to a pair of data I/O nodes, respectively, or to output the complementary input data, which is received through the pair of data I/O nodes, to the pair of I/O lines, in response to a column select signal and a gate control signal.

A data I/O circuit of a flash memory device includes a plurality of groups of page buffers, a plurality of groups of page buffer select circuits and a column select circuit. Each group of page buffers is connected to a corresponding group of bit line pairs. Each group of page buffer select circuits is arranged to output corresponding complementary input data, which is received through I/O line pairs, to a corresponding group of page buffers, or to output corresponding complementary sensing data, which is stored in the corresponding group of page buffers to the corresponding I/O line pair, in response to a corresponding buffer select signal. The column select circuit is arranged to output the complementary sensing data of any one of the groups of page buffers, which is received through one of the I/O line pairs, to the pair of data I/O nodes, or to output the complementary input data of any one of the groups of page buffer select circuits, which is received through the pair of data I/O nodes, to one of the I/O line pairs, in response to a column select signal and a gate control signal.

DETAILED DESCRIPTION

Figure 1:
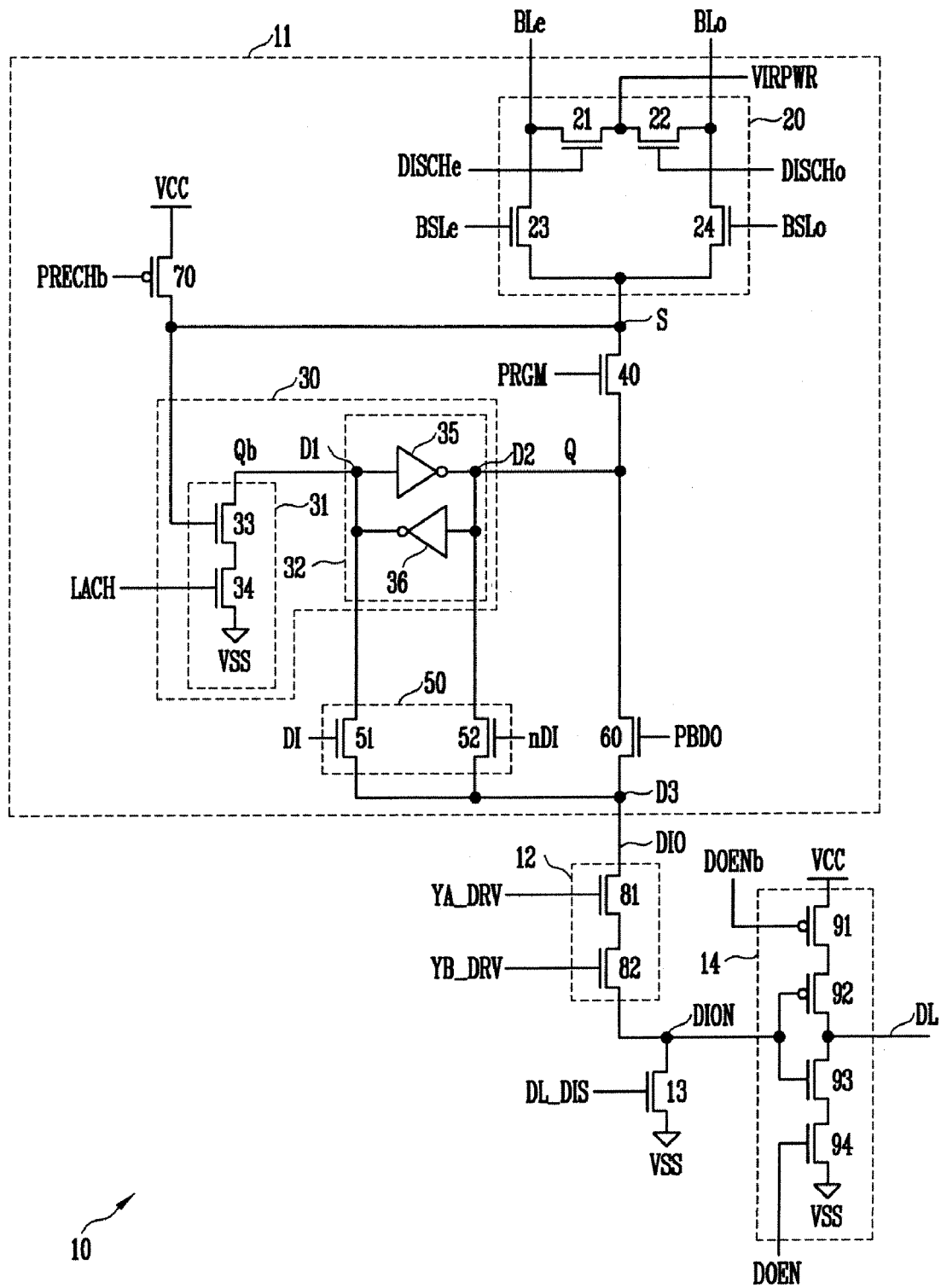
FIG. 1 is a circuit diagram of a data I/O circuit of a flash memory device in the related art.
Figure 2:
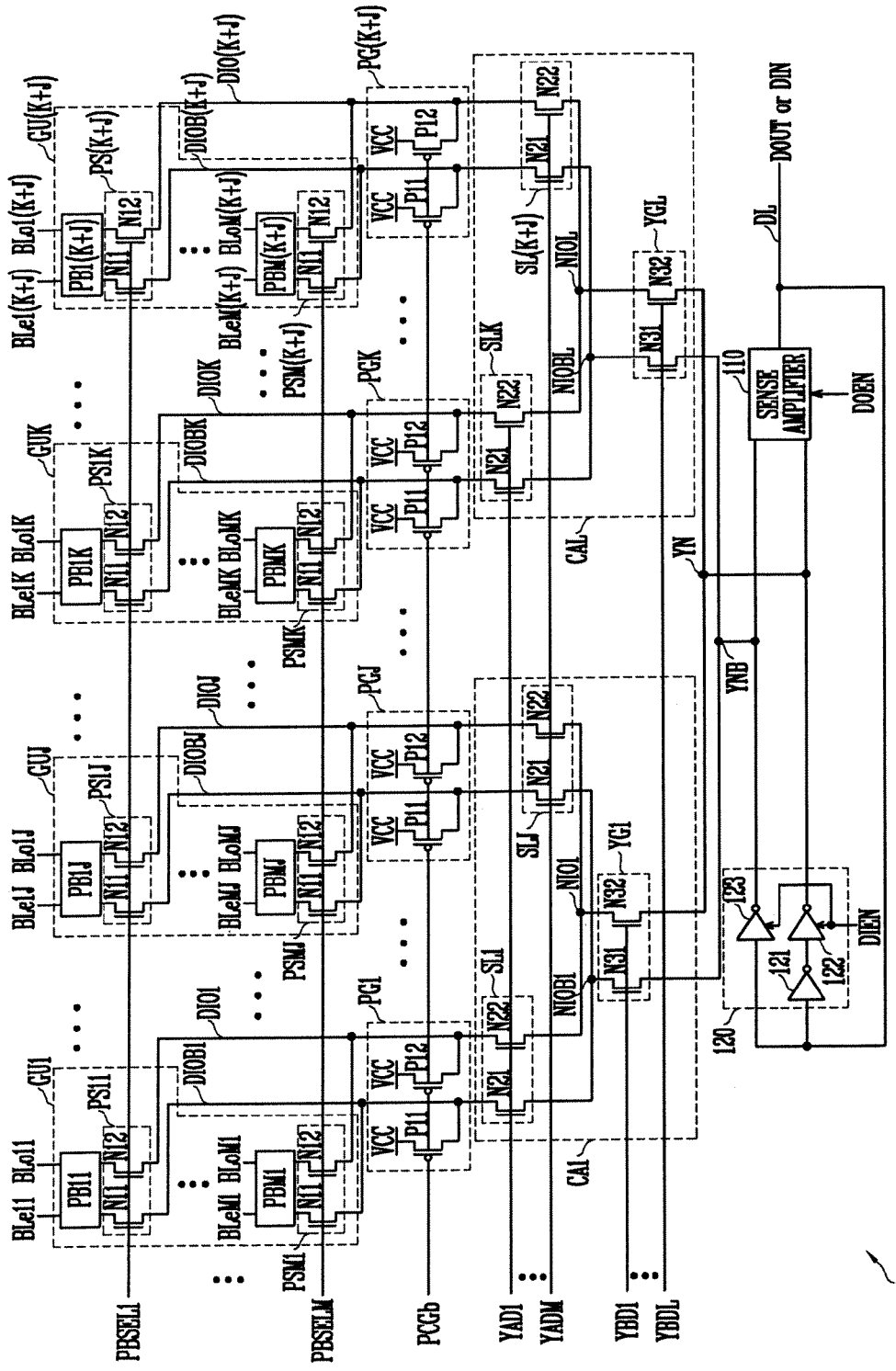
FIG. 2 is a circuit diagram of an example of a data I/O circuit of a flash memory device.

FIG. 2 is a circuit diagram of an example of a data I/O circuit of a flash memory device. Referring to FIG. 2, the data I/O circuit 100 includes a plurality of page buffers PB11 to PBM(K+J) (where each of M, K and J is an integer), a plurality of page buffer select circuits PS11 to PSM(K+J), precharge circuits PG1 to PG(K+J), column select circuits CA1 to CAL (where L is an integer), a sense amplifier 110 and an input circuit 120. The plurality of page buffers PB11 to PBM(K+J) can be classified into $1^{st}$ to $(K+J)^{th}$ groups GU1 to GU(K+J). This will be described below in more detail.

The page buffers PB11 to PBM1 are included in the first group GU1. The page buffers PB1J to PBMJ are included in the $J^{th}$ group GUJ. Furthermore, the page buffers PB1K to PBMK are included in the $K^{th}$ group GUK. The page buffers PB1(K+J) to PBM(K+J) are included in the (K+J)$^{th}$ group GU(K+J). Furthermore, the page buffers PB11 to PBM(K+J) of the 1$^{st}$ to (K+J)$^{th}$ group GU(K+J) are connected to bit line pairs BLe11, BLo11 to BLeM(K+J) and BLoM(K+J) of the 1$^{st}$ to (K+J)$^{th}$ groups, respectively. In more detail, for example, the page buffer PB11 is connected to the bit line pair BLe11, BLo11 and the page buffer PBM1 is connected to the bit line pair BLeM1, BLoM1. Furthermore, the page buffer PB1J is connected to the bit line pair BLe1J, BLo1J. The page buffer PBMJ is connected to the bit line pair BLeMJ, BLoMJ.

The page buffer select circuits PS11 to PSM(K+J) of the 1$^{st}$ to (K+J)$^{th}$ groups GU(K+J) are connected between the page buffers PB11 to PBM(K+J) of the 1$^{st}$ to (K+J)$^{th}$ groups GU(K+J) and the 1$^{st}$ to (K+J)$^{th}$ I/O line pairs DIO1, DIOB1 to DIO(K+J) and DIOB(K+J). In this case, the construction and operation of the page buffers PB11 to PBM(K+J) and the page buffer select circuits PS11 to PSM(K+J) of the 1$^{st}$ to (K+J)$^{th}$ groups GU(K+J) are the same. Only the first group GU1 will be described.

The page buffer select circuits PS11 to PSM1 included in the first group GU1 are connected between the page buffers PB11 to PBM1 and the first I/O line pair DIO1, DIOB1, respectively. For example, the page buffer select circuit PS11 is connected between the page buffer PB11 and the first I/O line pair DIO1, DIOB1. The page buffer select circuit PSM1 is connected between the page buffer PBM1 and the first I/O line pair DIO1, DIOB1.

The page buffer select circuits PS11 to PSM1 output first complementary input data (not shown), which is received through the first I/O line pair DIO1, DIOB, to the first group of the page buffers PB11 to PBM1, or first complementary sensing data (not shown), which is stored in the first group of the page buffers PB11 to PBM1, to the first I/O line pair DIO1, DIOB1, in response to 1$^{st}$ to M$^{th}$ buffer select signals (PBSEL1 to PBSELM), respectively. If one of the 1$^{st}$ to M$^{th}$ buffer select signals (PBSEL1 to PBSELM) is enabled, the remaining select signals are disabled. Therefore, when one of the page buffer select circuits PS11 to PSM1 operates, the remaining page buffer select circuits do not operate. This will be described in more detail below.

Each of the page buffer select circuits PS11 to PSM1 includes NMOS transistors N11, N12. For example, an NMOS transistor N11 of the page buffer select circuit PS11 is connected between the I/O line DIOB1 and the page buffer PB11. Furthermore, the NMOS transistor N12 is connected between the I/O line DIO1 and the page buffer PB11. The NMOS transistors N11, N12 of page buffer select circuit PS11 are turned on or off at the same time in response to the first buffer select signal (PBSEL1). When the NMOS transistors N11, N12, of page buffer select circuit PS11 are turned on, they connect the page buffer PB11 to the first I/O line pair DIO1, DIOB1. For example, if the first buffer select signal (PBSEL1) is enabled and the 2$^{nd}$ to M$^{th}$ buffer select signals (PBSEL2 to PBSELM) are all disabled, only the NMOS transistors N11, N12 of the page buffer select circuit PS11 are turned on and the NMOS transistors N11, N12 of the page buffer select circuits PS12 to PSM1 are all turned off. As a result, only the page buffer PB11 is connected to the first I/O line pair DIO1, DIOB1.

The precharge circuits PG1 to PG(K+J) are connected to the 1$^{st}$ to (K+J)$^{th}$ I/O line pairs DIO1, DIOB1 to DIO(K+J) and DIOB(K+J), respectively. The precharge circuits PG1 to PG(K+J) precharge the 1$^{st}$ to (K+J)$^{th}$ I/O line pairs DIO1, DIOB1 to DIO(K+J) and DIOB(K+J) with the internal voltage (VCC) level at the same time in response to a precharge control signal (PCGb). In more detail, each of the precharge circuits PG1 to PG(K+J) includes PMOS transistors P11, P12. For example, the PMOS transistor P11 of the precharge circuit PG1 is connected between an internal voltage (VDD) and the I/O line DIOB1. The PMOS transistor P12 is connected between the internal voltage (VDD) and the I/O line DIO1. The PMOS transistors P11, P12 of the precharge circuit PG1 are turned on at the same time in response to the precharge control signal (PCGb). As a result, the I/O lines DIO1, DIOB1 are precharged with the internal voltage (VCC) level at the same time. The construction and operation of the column select circuits CA1 to CAL are the same. Only the column select circuit CA1 will be described below accordingly.

The column select circuit CA1 includes select circuits SL1 to SLJ and a gate circuit YG1. The select circuits SL1 to SLJ are connected to the 1$^{st}$ to J$^{th}$ I/O line pairs DIO1, DIOB1 to DIOJ, DIOBJ and are also connected to a pair of internal I/O nodes NIOB1, NIO1. The select circuits SL1 to SLJ connect an I/O line pair connecting thereto to the pair of internal I/O nodes NIOB1, NIO1 or separate the I/O line pair connecting thereto from the pair of internal I/O nodes NIOB1, NIO1 in response to 1$^{st}$ to M$^{th}$ column select signals (YAD1 to YAM), respectively.

For example, the select circuit SL1 is connected between the first I/O line pair DIO1, DIOB1 and the pair of internal I/O nodes NIOB1, NIO1. The select circuit SL1 connects the first I/O line pair DIO1, DIOB1 to the pair of internal I/O nodes NIOB1, NIO1 or separate the first I/O line pair DIO1, DIOB1 from the pair of internal I/O nodes NIOB1, NIO1, in response to the first column select signal (YAD1). When one of the 1$^{st}$ to M$^{th}$ column select signals (YAD1 to YAM) is enabled, the remaining select signals can be disabled. Therefore, when one of the select circuits SL1 to SLJ connects an I/O line pair corresponding thereto to the internal I/O nodes NIOB1, NIO1, the remaining select circuits separate I/O line pairs corresponding thereto from the internal I/O nodes NIOB1, NIO1. Each of the select circuits SL1 to SLJ includes NMOS transistors N21, N22. For example, the NMOS transistor N21 of the select circuit SL1 is connected between the I/O line DIOB1 and the internal I/O node NIOB1 and the NMOS transistor N22 is connected between the I/O line DIO1 and the internal I/O node NIO1. The NMOS transistors N21, N22 of select circuit SL1 are turned on at the same time when the first column select signal (YAD1) is enabled.

The gate circuit YG1 is connected between the internal I/O nodes NIOB1, NIO1 and the data I/O nodes YNB, YN. The gate circuit YG1 connects the internal I/O nodes NIOB1, NIO1 to the data I/O nodes YNB, YN, respectively, or separates the internal I/O nodes NIOB1, NIO1 from the data I/O nodes YNB, YN, in response to a gate control signal (YBD1). In more detail, the gate circuit YG1 can include NMOS transistors N31, N32. The NMOS transistor N31 is connected between the internal I/O node NIOB1 and a data I/O node YBN and the NMOS transistor N32 is connected between the internal I/O node NIO1 and the data I/O node YN. The NMOS transistors N31, N32 of the gate circuit YG1 are turned on at the same time when the gate control signal (YBD1) is enabled.

The sense amplifier 110 senses and amplifies any one of the 1$^{st}$ to J$^{th}$ complementary sensing data, which are received from the pair of data I/O nodes YNB, YN, in response to a data output control signal (DOEN), and outputs the amplified data to a data line DL as output data (DOUT). The input circuit 120 outputs any one of the 1$^{st}$ to J$^{th}$ complementary input data to the pair of data I/O nodes YNB, YN in response to input data (DIN) received through the data line DL in response to a data input control signal (DIEN).

The input circuit 120 can include inverters 121 to 123. The inverter 121 inverts the input data (DIN) received through the data line DL1. The inverter 122 inverts the output signal of the inverter 121 in response to the data input control signal (DIEN) and outputs the inverted signal to the data I/O node YN as input data (DA). Furthermore, the inverter 123 inverts the input data (DIN) received through the data line DL1 in response to the data input control signal (DIEN) and outputs the inverted signal to the data I/O node YBN as input data (DAB).

Figure 3:
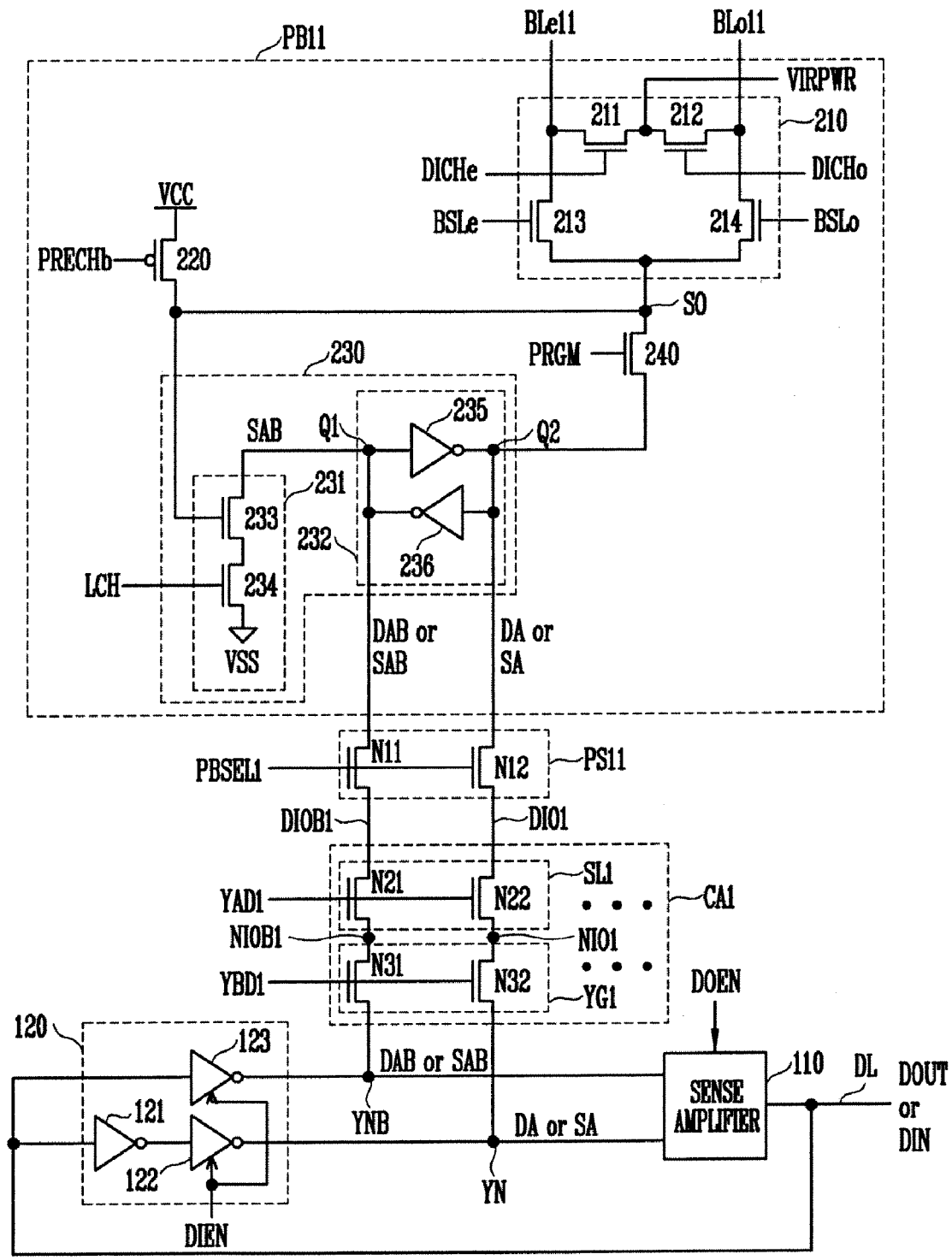
FIG. 3 is a detailed circuit diagram for illustrating a connection relation between the page buffer, the page buffer select circuit and the column select circuit shown in FIG. 2.

FIG. 3 is a detailed circuit diagram for illustrating the connection relation between the page buffer PB11, the page buffer select circuit PS11 and the column select circuit CA1 shown in FIG. 2. The construction and operation of the page buffers PB11 to PBM(K+J) are substantially the same.

Referring to FIG. 3, the page buffer PB11 includes a bit line select circuit 210, a precharge circuit 220, a register circuit 230 and a program control circuit 240. The bit line select circuit 210 includes NMOS transistors 211 to 214. The NMOS transistors 211, 212 precharge or discharge the bit lines BLe11, BLo11 with a voltage level of a bit line control signal (VIRPWR) in response to discharge signals (DICHe, DICHo), respectively. One of the NMOS transistors 213, 214 is turned on in response to bit line select signals (BSLe, BSLo) and connects one of the bit lines BLe11, BLo11 to a sensing node SO.

The precharge circuit 220 can be implemented using a PMOS transistor and precharges the sensing node SO with the internal voltage (VCC) level in response to the precharge control signal (PRECHb). The register circuit 230 includes a sensing circuit 231 and a latch circuit 232. The sensing circuit 231 includes NMOS transistors 233, 234 and the latch circuit 232 includes inverters 235, 236. The sensing circuit 231 senses a voltage level of the sensing node SO in response to a latch signal (LCH) and outputs sensing data (SAB) to a first node Q1. The latch circuit 232 latches the sensing data (SAB), which are received from the first node Q1, and outputs inverted sensing data (SA) to a second node Q2 during a read operation. Furthermore, during the program operation, the latch circuit 232 latches complementary input data (DAB, DA) respectively received through the first and second nodes Q1, Q2. The program control circuit 240 can be implemented using a NMOS transistor and outputs the input data (DA) stored in the latch circuit 232 to the sensing node SO in response to the program control signal (PGM).

The NMOS transistor N11 of the page buffer select circuit PS11 is connected between the first node Q1 and the I/O line DIOB1 and the NMOS transistor N12 is connected between the second node Q2 and the I/O line DIO1. The NMOS transistors N11, N12 are turned on at the same time when the first buffer select signal (PBSEL1) is enabled. As a result, during the read operation, the complementary sensing data (SAB, SA) of the first and second nodes Q1, Q2 are transmitted to the I/O lines DIOB1, DIO1, respectively. Furthermore, during the program operation, the complementary input data (DAB, DA) of the I/O lines DIOB1, DIO1 are transmitted to the first and second nodes Q1, Q2.

It has been shown in FIG. 3 that only the select circuit SL1 and the gate circuit YG1 are included in the column select circuit CA1. The NMOS transistor N21 of the select circuit SL1 is connected between the I/O line DIOB1 and the internal I/O node NIOB1. The NMOS transistor N22 is connected between the I/O line DIO1 and the internal I/O node NIO1. When the NMOS transistors N21, N22 are turned on at the same time in response to the first column select signal (YAD1), the NMOS transistors N21, N22 transmit the complementary sensing data (SAB, SA) of the I/O lines DIOB1, DIO1 to the internal I/O nodes NIOB1, NIO1, respectively, or the complementary input data (DAB, DA) of the internal I/O nodes NIOB1, NIO1 to the I/O lines DIOB1, DIO, respectively.

The NMOS transistor N31 of the gate circuit YG1 is connected between the internal I/O node NIOB1 and the data I/O node YBN. The NMOS transistor N32 is connected between the internal I/O node NIO1 and the data I/O node YBN. When the NMOS transistors N31, N32 are turned on at the same time in response to the gate control signal (YBD1), the NMOS transistors N31, N32 transmit the complementary sensing data (SAB, SA) of the internal I/O nodes NIOB1, NIO1 to the data I/O nodes YNB, YN, respectively, or the complementary input data (DAB, DA) of the data I/O nodes YNB, YN to the internal I/O nodes NIOB1, NIO1, respectively.

The data I/O operation of the data I/O circuit 100 will be described in more detail with reference to FIGS. 2 to 4.

Figure 4:
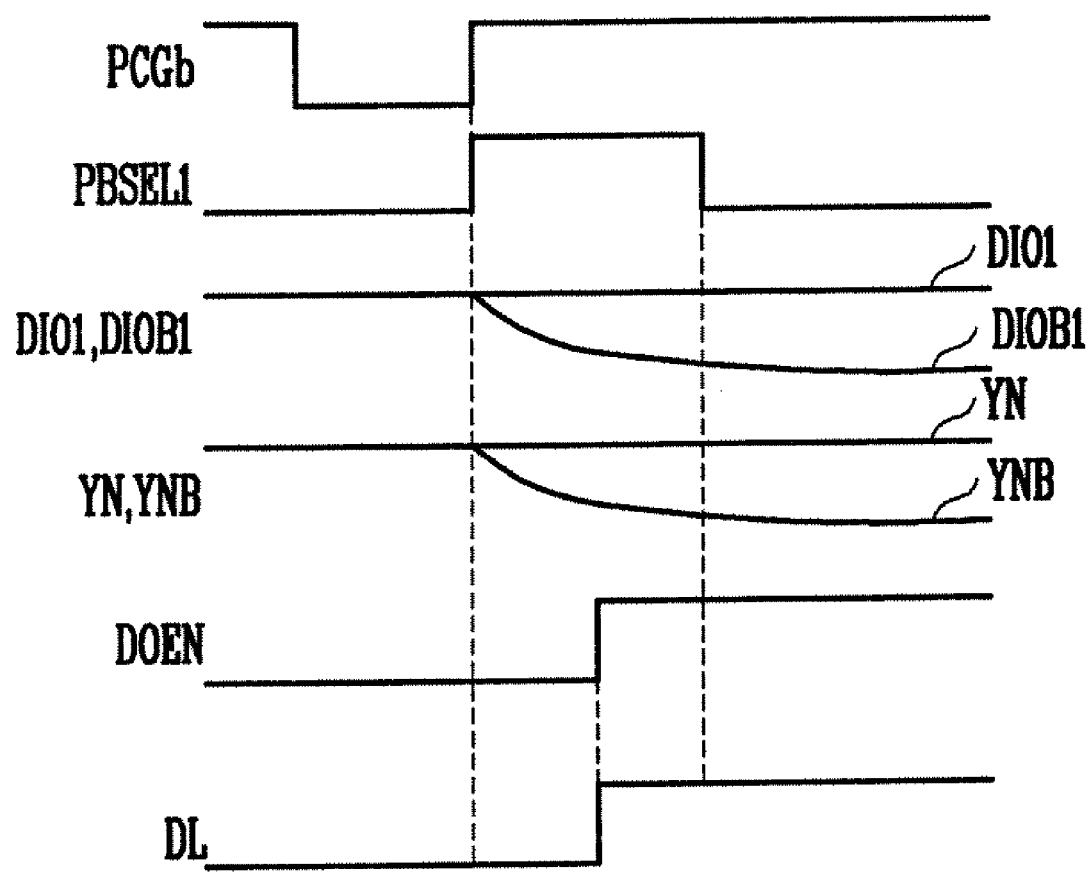
FIG. 4 is a timing diagram illustrating signals related to the data output operation of the page buffer, the page buffer select circuit and the column select circuit shown in FIG. 3.

FIG. 4 is a timing diagram illustrating signals related to the data output operation of the page buffer, the page buffer select circuit and the column select circuit shown in FIG. 3.

Referring to FIG. 4, the precharge control signal (PCGb) is disabled for a predetermined time and then enabled. When the precharge control signal (PCGb) is disabled, the precharge circuits PG1 to PG(K+J) precharge the $1^{st}$ to $(K+J)^{th}$ I/O line pairs DIO1, DIOB1 to DIO(K+J) and DIOB(K+J) with the internal voltage (VCC) level at the same time in response to the precharge control signal (PCGb). Thereafter, for example, if the buffer select signal (PBSEL1) is enabled and the $2^{nd}$ to $M^{th}$ buffer select signals (PBSEL2 to PBSELM) are disabled, the NMOS transistors N11, N12 of the page buffer select circuits PS11, . . . PS1J, . . . PS1K, . . . PS(K+J) are turned on at the same time in response to the buffer select signal (PBSEL1) and connect the first and second nodes Q1, Q2 of the page buffers PB11, . . . PB1J, . . . PB1K, . . . PB(K+J) to the I/O line pairs DIO1, DIOB1, . . . DIOJ, DIOBJ, . . . DIOK, DIOBK, . . . DIO(K+J) and DIOB(K+J) corresponding thereto. As a result, the complementary sensing data (SAB, SA) of the first and second nodes Q1, Q2 are transmitted to the I/O line pairs DIO1, DIOB1, . . . DIOJ, DIOBJ, . . . DIOK, DIOBK, . . . DIO(K+J) and DIOB(K+J). As a result, a voltage difference is generated between the I/O line pairs DIO1, DIOB1, . . . DIOJ, DIOBJ, . . . DIOK, DIOBK, . . . DIO(K+J) and DIOB(K+J). For example, as shown in FIG. 4, the I/O line DIO1 becomes the internal voltage (VCC) level and the I/O line DIOB1 becomes the ground voltage (VSS) level.

Thereafter, the first column select signal (YAD1) and the gate control signal (YBD1) are enabled, and the $2^{nd}$ to $M^{th}$ column select signals (YAD2 to YADM) and the gate control signals (YBD2 to YBDL) are disabled. As a result, the select circuits SL1 to SLK of the column select circuit CA1 connect corresponding I/O line pairs DIO1, DIOB1 to DIOK, DIOBK to the internal I/O nodes NIO1, NIOB1 to NIOL, NIOBL, respectively, in response to the first column select signal (YAD1). Furthermore, the gate circuit YG1 connects the internal I/O nodes NIO1, NIOB1 to the data I/O nodes YN, YBN, respectively, in response to the gate control signal (YBD1). As a result, only the I/O lines DIO1, DIOB1 are connected to the data I/O nodes YN, YBN and the complementary sensing data (SA, SAB) of the I/O lines DIO1, DIOB1 are transmitted to the data I/O nodes YN, YBN by means of the column select circuit CA1. As a result, as shown in FIG. 4, a voltage difference is generated between the data I/O nodes YN, YBN. Thereafter, if the data output control signal (DOEN) is enabled, the sense amplifier 110 is enabled to sense a voltage difference between the data I/O nodes YN, YBN. The sense amplifier 110 amplifies the sensed signal and outputs the result as the output data (DOUT).

As described above, in the data I/O circuit 100, data are input and/or output through a pair (i.e., a dual) of data I/O nodes. Therefore, it can further enhance the data I/O speed compared with that data are input and/or output through a single data I/O node. In addition, the data I/O circuit 100 includes a page buffer select circuit that selectively connects a page buffer to a pair of I/O lines. Therefore, the page buffer does not need to include circuits for data input or output. Accordingly, the size of the page buffer can be reduced.

As described above, in accordance with a data I/O circuit of a flash memory device, data is input and/or output through a dual data I/O node. Therefore, the data I/O speed can be increased and the size of a page buffer can be reduced.

Although certain examples of methods and apparatus constructed in accordance with the teachings of the invention have been described herein, the scope of coverage of this patent is not limited thereto. On the contrary, this patent covers all embodiments of the teachings of the invention fairly falling within the scope of the appended claims literally or under the doctrine of equivalents.

What is claimed as new and desired to be protected by Letters Patent of the United States is:

1. A data I/O circuit of a flash memory device, comprising:
    a page buffer connected to at least one pair of bit lines;
    a page buffer select circuit arranged to output complementary input data, which is received through a pair of I/O lines, to the page buffer, or outputs complementary sensing data stored in the page buffer to the pair of I/O lines, in response to a buffer select signal; and
    a column select circuit arranged to output the complementary sensing data, which is received through the pair of I/O lines, to a pair of data I/O nodes, respectively, or to output the complementary input data, which is received through the pair of data I/O nodes, to the pair of I/O lines, in response to a column select signal and a gate control signal.

2. The data I/O circuit of claim 1, wherein the page buffer comprises:
    a bit line select circuit arranged to connect one of the at least one pair of bit lines to a sensing node in response to bit line select signals and discharge signals;
    a precharge circuit arranged to precharge the sensing node with an internal voltage level in response to a precharge control signal;
    a register circuit comprising a sensing circuit and a latch circuit,
    wherein the sensing circuit is arranged to sense a voltage level of the sensing node in response to a latch signal and to output the sensed data to a first node, and wherein the latch circuit is arranged to latch the sensed data received from the first node and to output the latched sensed data to a second node during a read operation, or to latch the complementary input data received through the first and second nodes during a program operation; and
    a program control circuit arranged to output the input data stored in the latch circuit to the sensing node in response to a program control signal.

3. The data I/O circuit of claim 2, wherein the page buffer select circuit comprises switching circuits connected between the first and second nodes and the pair of I/O lines, arranged to connect the pair of I/O lines to the first and second nodes or to separate the pair of I/O lines from the first and second nodes, in response to the buffer select signal.

4. The data I/O circuit of claim 1, further comprising:
    a sense amplifier arranged to sense and amplify the complementary sensing data received from the pair of data I/O nodes and to output the amplified data to a data line as output data, in response to a data output control signal; and
    an input circuit arranged to output the complementary input data to the pair of data I/O nodes in response to the input data received through the data line in response to the data input control signal.

5. A data I/O circuit of a flash memory device, comprising:
    a plurality of groups of page buffers, wherein each group of page buffers is connected to a corresponding group of bit line pairs;
    a plurality of groups of page buffer select circuits, which each group of page buffer select circuits is arranged to output corresponding complementary input data, which is received through I/O line pairs, to a corresponding group of page buffers, or to output corresponding complementary sensing data, which is stored in the corresponding group of page buffers, to the corresponding I/O line pair, in response to a corresponding buffer select signal; and
    a column select circuit arranged to output the complementary sensing data of any one of the groups of page buffers, which is received through one of the I/O line pairs, to the pair of data I/O nodes, or to output the complementary input data of any one of the groups of page buffer select circuits, which is received through the pair of data I/O nodes, to one of the I/O line pairs, in response to a column select signal and a gate control signal.

6. The data I/O circuit as claimed in claim 5, wherein each of the plurality of groups of page buffer comprises:
    a bit line select circuit arranged to connect one of the groups of bit line pairs to a sensing node in response to bit line select signals and discharge signals;
    a precharge circuit arranged to precharge the sensing node with an internal voltage level in response to a precharge control signal;
    a register circuit comprising a sensing circuit and a latch circuit,
    wherein the sensing circuit is arranged to sense a voltage level of the sensing node in response to a latch signal and to output the sensed data to a first node, and wherein the latch circuit is arranged to latch the sensed data received from the first node and to output the latched sensed data to a second node during a read operation, or to latch the complementary input data received through the first and second nodes during a program operation; and
    a program control circuit arranged to output one of the complementary input data stored in the latch circuit to the sensing node in response to a program control signal.

7. The data I/O circuit of claim 6, wherein each of the plurality of groups of page buffer select circuits comprises switching circuits, which are respectively connected between the first and second nodes and one of the I/O line pairs, and arranged to connect the pair of I/O lines to the first and second nodes or to separate the pair of I/O lines from the first and second nodes in response to one of the buffer select signals.

8. The data I/O circuit of claim 5, wherein each of the plurality of groups includes a number of page buffer select circuits, wherein one of the page buffer select circuits arranged to connect a corresponding page buffer to one of the I/O line pairs in response to the buffer select signals, and each of the remaining page buffer select circuits is arranged to separate a page buffer corresponding thereto from one of the I/O line pairs.

9. The data I/O circuit of claim 5, further comprising:
a sense amplifier arranged to sense and amplify any one pair of the complementary sensing data, which are received from the pair of data I/O nodes, in response to a data output control signal, and to output the amplified data to a data line as output data; and
an input circuit arranged to output any pair of the complementary input data to the pair of data I/O nodes in response to data line received through the data line, in response to a data input control signal.

10. The data I/O circuit of claim 5, wherein the column select circuit includes:
a plurality of select circuits, wherein each select circuit is connected to a corresponding I/O line pair, and is arranged to connect a corresponding one of the I/O line pairs to a pair of internal I/O nodes, respectively, or separate the corresponding one of the I/O line pairs from the pair of internal I/O nodes, in response to the column select signals; and
a gate circuit arranged to connect the pair of the internal I/O nodes to a pair of data I/O nodes or to separate the pair of the internal I/O nodes from the pair of data I/O nodes, in response to the gate control signal,
wherein when one of the select circuits is arranged to connect the corresponding pair of I/O lines to the pair of internal I/O nodes, each of the remaining select circuits separates a pair of I/O lines corresponding thereto from the pair of the internal I/O nodes.

* * * * *